US012721219B2

(12) United States Patent
Wu et al.

(10) Patent No.: US 12,721,219 B2
(45) Date of Patent: Aug. 25, 2026

(54) INTEGRATED CIRCUIT PACKAGE AND METHOD

(71) Applicant: Taiwan Semiconductor Manufacturing Co., Ltd., Hsinchu (TW)

(72) Inventors: Chih-Wei Wu, Zhuangwei Township (TW); Ching-Feng Yang, Taipei (TW); Ying-Ching Shih, Hsinchu (TW); An-Jhih Su, Taoyuan (TW); Wen-Chih Chiou, Zhunan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 740 days.

(21) Appl. No.: 18/149,806

(22) Filed: Jan. 4, 2023

(65) Prior Publication Data

US 2024/0096848 A1 Mar. 21, 2024

Related U.S. Application Data

(60) Provisional application No. 63/407,376, filed on Sep. 16, 2022.

(51) Int. Cl.

| | |
|---|---|
| ***H10W 90/00*** | (2026.01) |
| *H10W 72/00* | (2026.01) |
| *H10W 74/00* | (2026.01) |
| *H10W 74/15* | (2026.01) |
| *H10W 80/00* | (2026.01) |

(52) U.S. Cl.
CPC ...... *H10W 90/00* (2026.01); *H10W 72/01953* (2026.01); *H10W 72/0198* (2026.01); *H10W 74/00* (2026.01); *H10W 74/15* (2026.01); *H10W 80/312* (2026.01); *H10W 80/327* (2026.01); *H10W 90/724* (2026.01); *H10W 90/734* (2026.01); *H10W 90/792* (2026.01)

(58) Field of Classification Search
None
See application file for complete search history.

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

TW 201806011 A 2/2018
TW 202036697 A 10/2020

*Primary Examiner* — Nicholas J Tobergte
(74) *Attorney, Agent, or Firm* — Slater Matsil, LLP

(57) ABSTRACT

A method of manufacturing a semiconductor device includes forming a first bonding layer over a substrate of a first wafer, the first wafer including a first semiconductor die and a second semiconductor die, performing a first dicing process to form two grooves that extend through the first bonding layer, the two grooves being disposed between the first semiconductor die and the second semiconductor die, performing a second dicing process to form a trench that extends through the first bonding layer and partially through the substrate of the first wafer, where the trench is disposed between the two grooves, and thinning a backside of the substrate of the first wafer until the first semiconductor die is singulated from the second semiconductor die.

20 Claims, 12 Drawing Sheets

100

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2007/0184583 | A1 | 8/2007 | Egawa | |
| 2009/0011543 | A1* | 1/2009 | Karta | H01L 23/3178 257/E23.116 |
| 2020/0312715 | A1* | 10/2020 | Choi | H01L 21/78 |

* cited by examiner 223
221
219
211
217
123
121
117
200B
123
121
117
123
121
117
200A
W1
123
121
150
20
117
224
119
100

INTEGRATED CIRCUIT PACKAGE AND METHOD

PRIORITY CLAIM AND CROSS-REFERENCE

This application claims the benefit of U.S. Provisional Application No. 63/407,376, filed on Sep. 16, 2022, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
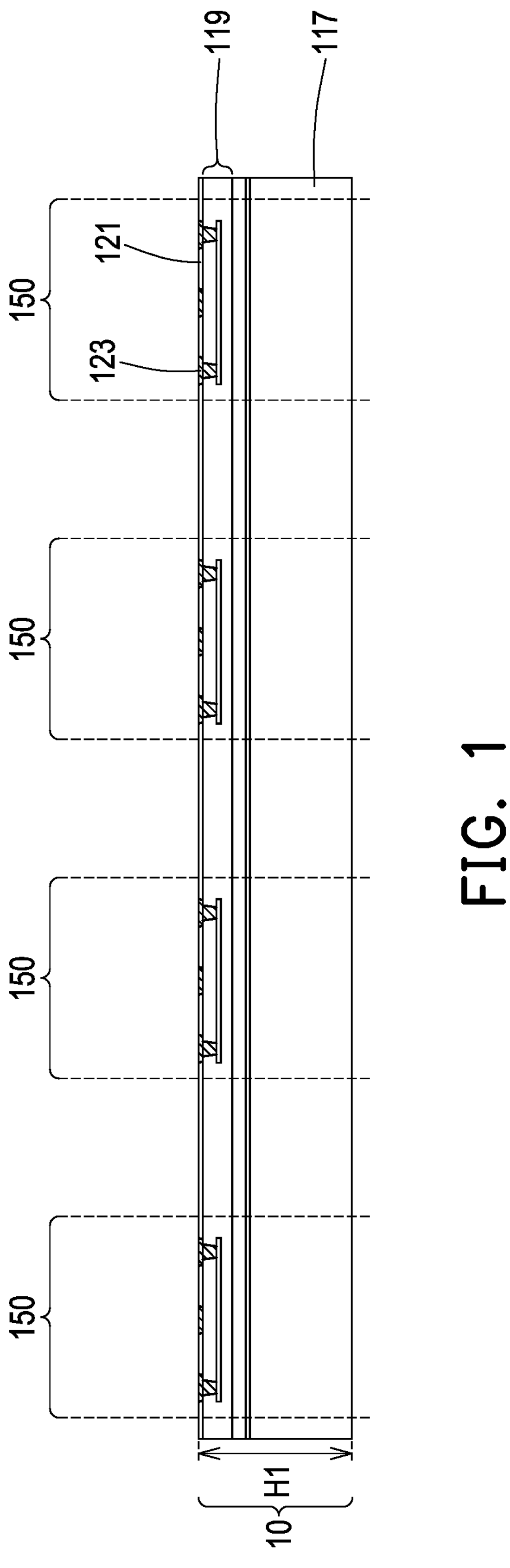
FIGS. 1 through 3B illustrate cross-sectional views and a top-down view of intermediate steps during a process for forming a semiconductor die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to bonding a top semiconductor device (e.g., a top die) to a bottom semiconductor device (e.g., a bottom die) in order to provide a 3D integrated chip (3DIC) package, such as a system on integrated chip (SoIC) package. A wafer comprising a number of semiconductor dies (e.g., top dies) is singulated to obtain singulated semiconductor dies. The wafer comprises a bonding layer over a semiconductor substrate. To singulate the wafer, a first plasma dicing process is performed to form two grooves in the wafer between adjacent semiconductor dies of the wafer. The two grooves may extend through the bonding layer. A second blade dicing process is then performed to cut the wafer along a dicing region between the two grooves and form a trench between the adjacent semiconductor dies, wherein the trench extends to a deeper depth than either of the two grooves. Subsequently, a backside thinning process (e.g., planarization process) may be employed to separate the adjacent semiconductor dies in regions defined by the trench. Advantageous features of one or more embodiments disclosed herein may allow for the singulation of a much thicker wafer (e.g., greater than 100 μm) while still using a plasma dicing process. Plasma dicing processes advantageously allow for highly-parallel, high throughput, and particle-free singulation of dies. In addition, the use of the first plasma dicing process to form the grooves in the bonding layer results in reduced damage and less physical impact to the bonding layer which is subsequently used to bond each of the singulated semiconductor dies (e.g., the top dies) to a bottom die. As a result, the bonding between each of the singulated semiconductor dies and the bottom die is improved, and device reliability is enhanced.

FIGS. 1 through 11 illustrate cross-sectional views, a top-down view and a perspective view of intermediate steps during a process for forming an integrated chip package 100, in accordance with some embodiments. In FIG. 1, a wafer 10 is illustrated. The wafer 10 comprises semiconductor dies 150. Each of the semiconductor dies 150 may be a logic die (e.g., application processor (AP), central processing unit, microcontroller, etc.), a memory die (e.g., dynamic random access memory (DRAM) die, hybrid memory cube (HBC), a static random access memory (SRAM) die, a wide input/output (wideIO) memory die, a magnetoresistive random access memory (mRAM) die, a resistive random access memory (rRAM) die, etc.), a power management die (e.g., power management integrated circuit (PMIC) dies), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like. Each semiconductor die 150 may also be a System-on-Chip (SoC)

die, or the like. The wafer 10 may include a substrate 117 (e.g., a semiconductor substrate), an interconnect structure 119 disposed on the substrate 117, a bonding layer 121 disposed on the interconnect structure 119, and bonding pads 123 disposed in the bonding layer 121 and exposed at the front surface of the wafer 10.

The substrate 117 of the wafer 10 may include a crystalline silicon wafer. The substrate 117 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 117 may comprise an active layer of a semiconductor-on-insulator (SOI) substrate. The substrate 117 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active and/or passive devices, such as transistors, diodes, capacitors, resistors, etc., may be formed in and/or on the substrate 117. The devices may be interconnected by the interconnect structure 119. The interconnect structure 119 electrically connects the devices on the substrate 117 to form one or more integrated circuits. The interconnect structure 119 may include one or more dielectric layers (for example, one or more interlayer dielectric (ILD) layers, intermetal dielectric (IMD) layers, or the like) and interconnect wirings or metallization patterns embedded in the one or more dielectric layers. The material of the one or more dielectric layers may include silicon oxide ($SiO_x$, where x>0), silicon nitride ($SiN_x$, where x>0), silicon oxynitride ($SiO_xN_y$, where x>0 and y>0), or other suitable dielectric material. The interconnect wirings may include metallic wirings. For example, the interconnect wirings include copper wirings, copper pads, aluminum pads or combinations thereof that are formed by one or more single damascene processes, dual damascene processes, or the like.

The bonding layer 121 may comprise a dielectric layer. Bonding pads 123 are embedded in the bonding layer 121, and the bonding pads 123 allow connections to be made to the interconnect structure 119 and the devices on the substrate 117. The material of the bonding layer 121 may be silicon oxide ($SiO_x$, where x>0), silicon nitride ($SiN_x$, where x>0), silicon oxynitride ($SiO_xN_y$, where x>0 and y>0), tetraethyl orthosilicate (TEOS), or other suitable dielectric material, and the bonding pads 123 may comprise conductive pads (e.g., copper pads), conductive vias (e.g., copper vias), or combinations thereof. The bonding layer 121 may be formed by depositing a dielectric material over the interconnect structure 119 using a chemical vapor deposition (CVD) process (e.g., a plasma enhanced CVD process or other suitable process); patterning the dielectric material to form the bonding layer 121 including openings or through holes; and filling conductive material in the openings or through holes defined in the bonding layer 121 to form the bonding pads 123 embedded in the bonding layer 121.

In an embodiment, a height H1 of the wafer 10 may be in a range from 300 μm to 800 μm. As will be explained in greater detail below, various embodiments allow for plasma dicing processes to be applied during the singulation of the wafer 10 even when the wafer 10 is relatively thick (e.g., having a thickness H1 in the above range). As a result, the singulation of the wafer 10 may be achieved with high throughput and lower defects (e.g., particle-free singulation).

Figure 2:
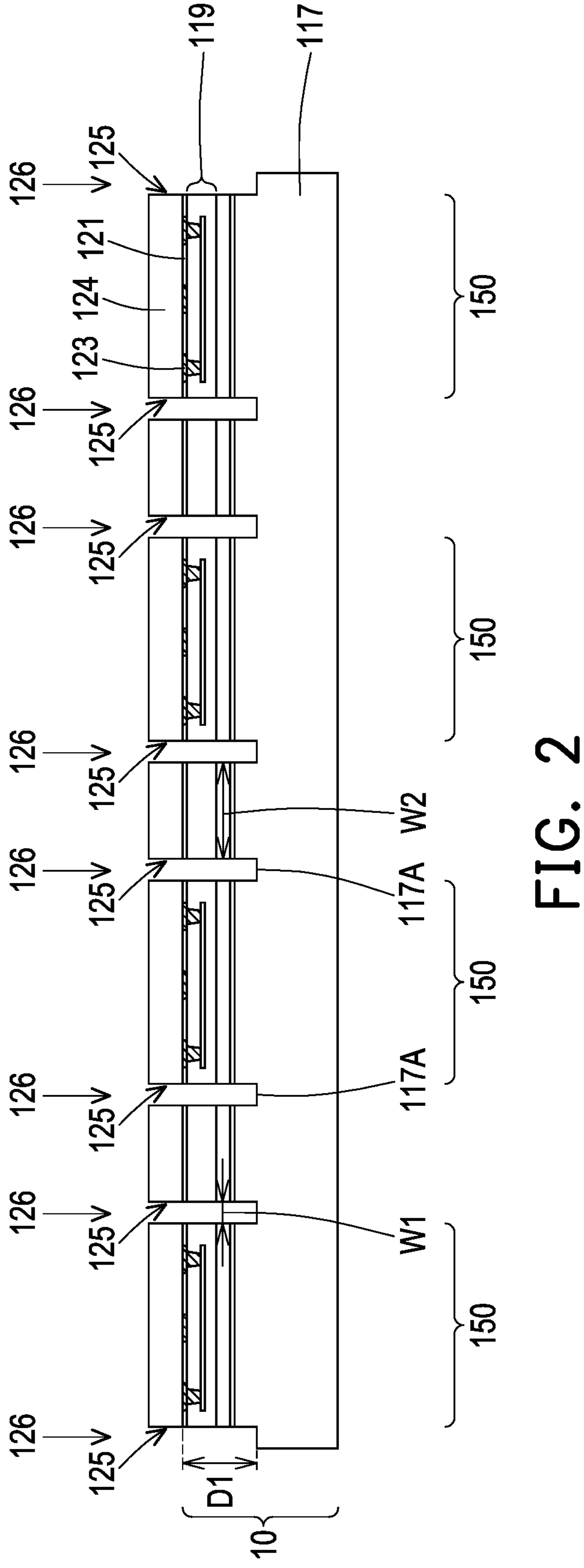

In FIG. 2, a mask layer 124 (e.g., a photoresist) is formed over the wafer 10, such as over the bonding layer 121 and the bonding pads 123. The mask layer 124 is patterned using suitable development and exposure techniques to form openings in the mask layer that expose top surfaces of the wafer 10. A plasma dicing process 126 is then performed to form grooves 125 that extend partially through the exposed portions of the wafer 10. In an embodiment, the plasma dicing process 126 is a dry etch process that comprises a fluorine plasma, or the like that can be used to etch narrow, deep vertical trenches. In an embodiment, the plasma dicing process 126 may be a dry plasma process, such as a deep reactive ion etching (DRIE) process using plasma gases that comprise sulphur hexafluoride ($SF_6$), Octafluorocyclobutane ($C_4F_8$), or the like. In other embodiments, the plasma dicing process 126 may be performed using plasma gases comprising $CF_4$, $SF_4$, $NF_3$, or the like. As a result of the plasma dicing process 126, a first groove 125 and a second groove 125 is disposed between adjacent sidewalls of pairs of the semiconductor dies 150. Each groove 125 may have a depth D1 that is in a range from 10 μm to 50 μm, and a width W1 that is in a range from 2 μm to 50 μm. The first groove 125 and the second groove 125 with the depth D1 in the range from 10 μm to 50 μm facilitates an easier singulation of the semiconductor dies 150 following a subsequent blade dicing process 128 (shown in FIG. 3A), and a subsequent thinning process (shown in FIG. 4). In some embodiments, each groove 125 may extend through the bonding layer 121, the interconnect structure 119, and partially through the substrate 117, wherein a bottom surface of the groove is defined by a first surface 117A of the substrate 117. In some embodiments, each groove 125 may extend through the bonding layer 121 and the interconnect structure 119 without extending into the substrate 117 such that the groove 125 exposes a topmost surface of the substrate 117 (e.g., as shown in FIG. 3C). In an embodiment, a width W2 between two adjacent grooves 125 is in a range from 20 μm to 500 μm.

Figure 3A:
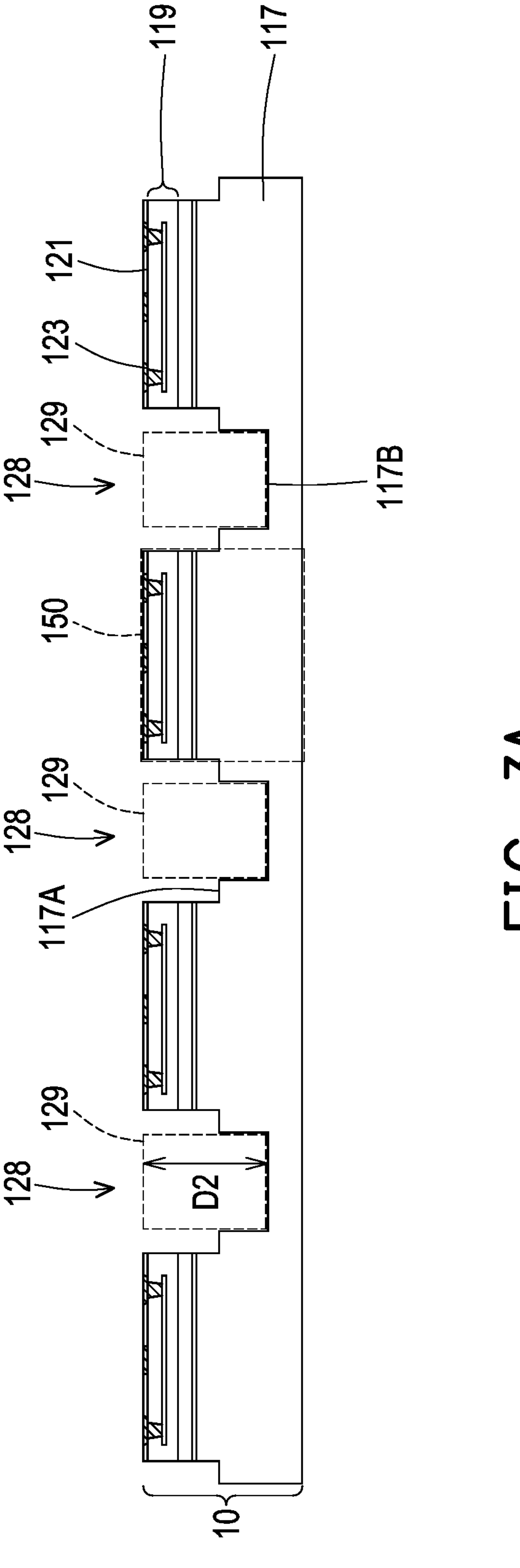
FIG. 3C illustrates a perspective view of intermediate steps during a process for forming the semiconductor die in accordance with other embodiments.
Figure 3C:
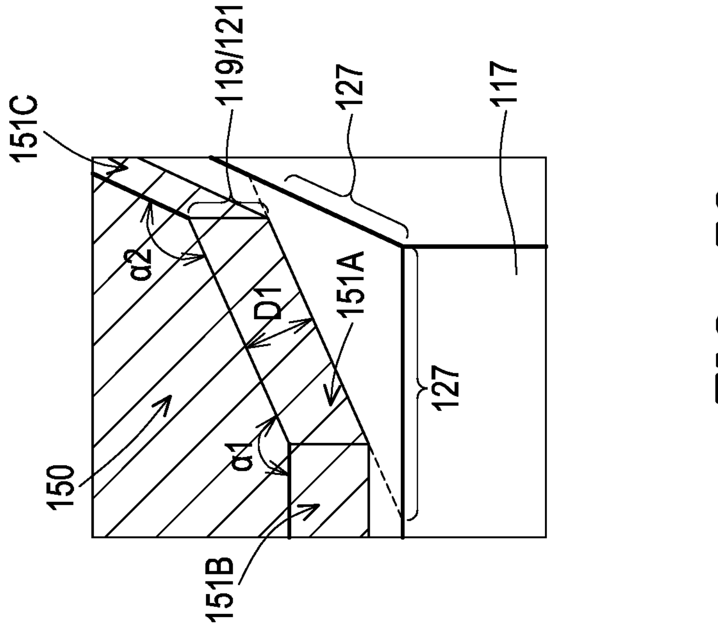

In FIG. 3A, the mask layer 124 is removed using an acceptable ashing or stripping process. A blade dicing process 128 is then performed along dicing paths 129 (indicated by the dashed lines in FIG. 3A). Each dicing path 129 is disposed between adjacent semiconductor dies 150. In addition, each dicing path 129 may be disposed between two adjacent grooves 125, and the dicing path 129 may partially overlap with the adjacent grooves 129. The blade dicing process 128 forms trenches along the dicing paths 129 that extend below bottom surfaces of the grooves 125. A bottom surface of each of the trenches is defined by a second surface 117B of the substrate 117. The second surfaces 117B may be disposed at a lower point than the first surfaces 117A. A depth D2 of each trench measured from a point that is level with a top surface of the bonding layer 121 to a bottom surface of the trench is in a range from 50 μm to 775 μm. In an embodiment, the depth D2 is greater than the depth D1. The blade dicing process 128 comprises using an abrasive disc or blade rotating at high speed to cut along the dicing path 129. The blade tip may comprise abrasive grit or a thin diamond layer.

Figure 3B:
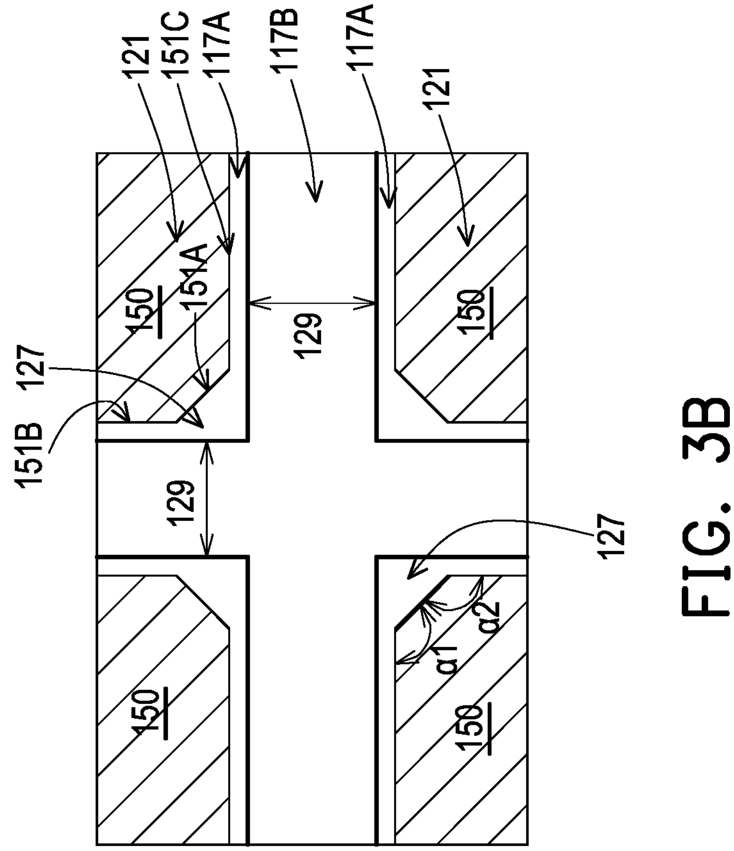

FIG. 3B illustrates a top-down view of a portion of the carrier 10 after the blade dicing process 128 is performed.

FIG. 3B illustrates the second surface 117B of the trenches along the dicing path 129 disposed between adjacent semiconductor dies 150. FIG. 3B also illustrates the first surface 117A of the substrate 117 disposed around each semiconductor die 150, the first surface 117A being formed during the plasma dicing process 126 used to form the grooves 125 that were described in FIG. 2 above. During the plasma dicing process 126, the bonding layer 121, the interconnect structure 119, and top portions of the substrate 117 are removed in corner regions 127 of each semiconductor die 150, which exposes the first surface 117A in these corner regions 127. Each corner region 127 is adjacent a first sidewall 151A of each semiconductor die 150. Each first sidewall 151A may be between and adjacent to a second sidewall 151B and a third sidewall 151C of the semiconductor die 150. The first sidewall 151A may be slanted in a top down view such that it is not be disposed at a right angle relative to the second sidewall 151B and the third sidewall 151C. In an embodiment, an angle $\alpha 1$ between the first sidewall 151A and the second sidewall 151B is in a range from 130° to 140°, and an angle $\alpha 2$ between the first sidewall 151A and the third sidewall 151C is in a range from 130° to 140°. Advantages can be achieved by removing the bonding layer 121, the interconnect structure 119, and the top portions of the substrate 117 in the corner regions 127 during the plasma dicing process 126. These include a better encapsulation of each semiconductor die 150 during the subsequent formation of the encapsulant 224 (described subsequently in FIG. 7).

FIG. 3C illustrates a perspective view of a portion of a semiconductor die 150 after the blade dicing process 128 is performed, in accordance with other embodiments. Unless specified otherwise, like reference numerals in this embodiment (and subsequently discussed embodiments) represent like components in the embodiment shown in FIGS. 1 through 3B formed by like processes. Accordingly, the process steps and applicable materials may not be repeated herein. The embodiment of FIG. 3C differs from the embodiment in FIG. 3B in that during the plasma dicing process 126, the bonding layer 121 and the interconnect structure 119 are removed in corner regions 127 of each semiconductor die 150, which exposes a top surface of the substrate 117 in these corner regions 127. As a result, the bonding layer 121 and the interconnect structure 119 may be recessed from and not co-terminus with sidewalls of the semiconductor die 150. Each corner region 127 is adjacent a first sidewall 151A of each semiconductor die 150. Each first sidewall 151A is adjacent to a second sidewall 151B of the semiconductor die 150, and each first sidewall 151A is also adjacent to a third sidewall 151C of the semiconductor die 150. Similar to the embodiment of FIG. 3B, the first sidewall 151A may be slanted in a top down view such that it is not be disposed at a right angle relative to the second sidewall 151B and the third sidewall 151C. In an embodiment, an angle $\alpha 1$ between the first sidewall 151A and the second sidewall 151B is in a range from 130° to 140°, and an angle $\alpha 2$ between the first sidewall 151A and the third sidewall 151C is in a range from 130° to 140°. Advantages can be achieved by removing the bonding layer 121 and the top portions of the substrate 117 in corner regions 127 during the plasma dicing process 126. These include a better encapsulation of each semiconductor die 150 during the subsequent formation of the encapsulant 224 (described subsequently in FIG. 7).

Figure 4:
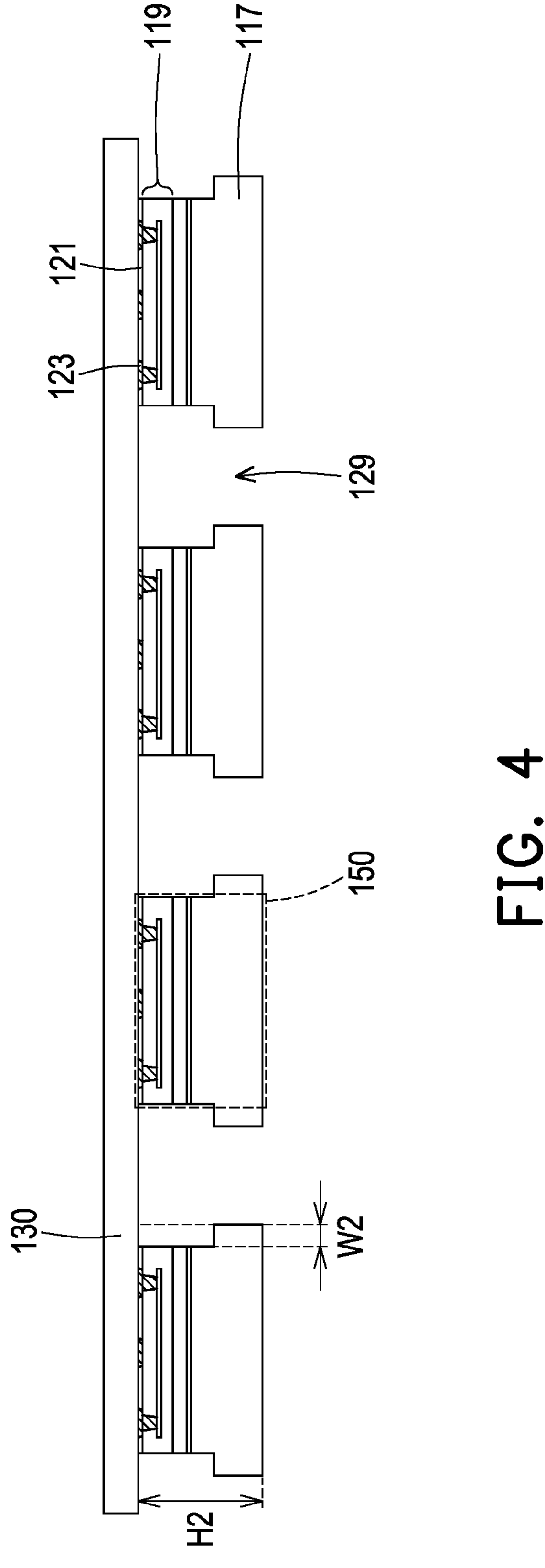
FIGS. 4 and 5 illustrate cross-sectional views of intermediate steps during a process for forming the semiconductor die in accordance with some embodiments.

In FIG. 4, top surfaces of the carrier 10 (e.g., including the bonding layer 121 and the bonding pads 123) are attached to a carrier substrate 130 through the use of an adhesive layer (not shown in the Figures). In an embodiment the carrier substrate 130 comprises, for example, silicon based materials, such as glass or silicon oxide, or other materials, such as aluminum oxide, combinations of any of these materials, or the like. A thinning process is then performed on a back side of the wafer 10 which results in the singulation of the semiconductor dies 150 from each other along the dicing paths 129. The thinning process may be performed, e.g., using mechanical grinding or chemical mechanical polishing (CMP) processes whereby chemical etchants and abrasives are utilized to react and grind away portions of the substrate 117 until each semiconductor die 150 is singulated from the other semiconductor dies 150. The singulated semiconductor dies 150 may subsequently be referred to as top dies. In an embodiment, after the thinning process, a height H2 of each semiconductor die 150 of the wafer 10 may be in a range from 50 μm to 400 μm. In an embodiment, the height H2 of each semiconductor die 150 may be greater than 50 μm. A cleaning process or rinse may then be performed that comprises de-ionized water.

Advantages can be achieved as a result of singulating the wafer 10 that comprises the bonding layer 123 over the substrate 117. A singulation process is performed to singulate the wafer 10 into the singulated semiconductor dies 150. To singulate the wafer 10, the plasma dicing process 126 is performed to form a first groove 125 that is disposed adjacent to a first sidewall of each semiconductor die 150, and a second groove 125 that is disposed adjacent to a second sidewall of the semiconductor die 150, wherein the first sidewall is on an opposite side of the semiconductor die 150 as the second sidewall, and wherein each of the first groove 125 and the second groove 125 has the depth D1 that is in the range from 10 μm to 50 μm. In this way, two grooves 125 are formed in the wafer 10 between adjacent semiconductor dies 150 of the wafer 10. The two grooves 125 extend through the bonding layer 123. The blade dicing process 128 is then performed to cut the wafer 10 along the dicing path 129 between the two grooves 125 and form a trench between the adjacent semiconductor dies 150. To complete the singulation of the wafer 10, a thinning process is then performed on the back side of the wafer 10 which results in the singulation of the semiconductor dies 150 from each other along the dicing paths 129. Advantageous features of one or more embodiments disclosed herein may allow for the singulation of a much thicker wafer 10 (e.g., greater than 100 μm) while still using a plasma dicing process, allowing for the singulation of the semiconductor dies 150 with larger heights using plasma dicing processes. Plasma dicing allows for highly-parallel, high throughput, and particle-free singulation of dies. In addition, the use of the plasma dicing process 126 to form the grooves 125 in the bonding layer 123 results in reduced damage and less physical impact to the bonding layer 123 which is subsequently used to bond each of the singulated semiconductor dies 150 to another package component (e.g., a wafer 20 described subsequently in FIG. 6). As a result, the bonding between each of the singulated semiconductor dies 150 and other package components is improved, and device reliability is enhanced.

Figure 5:
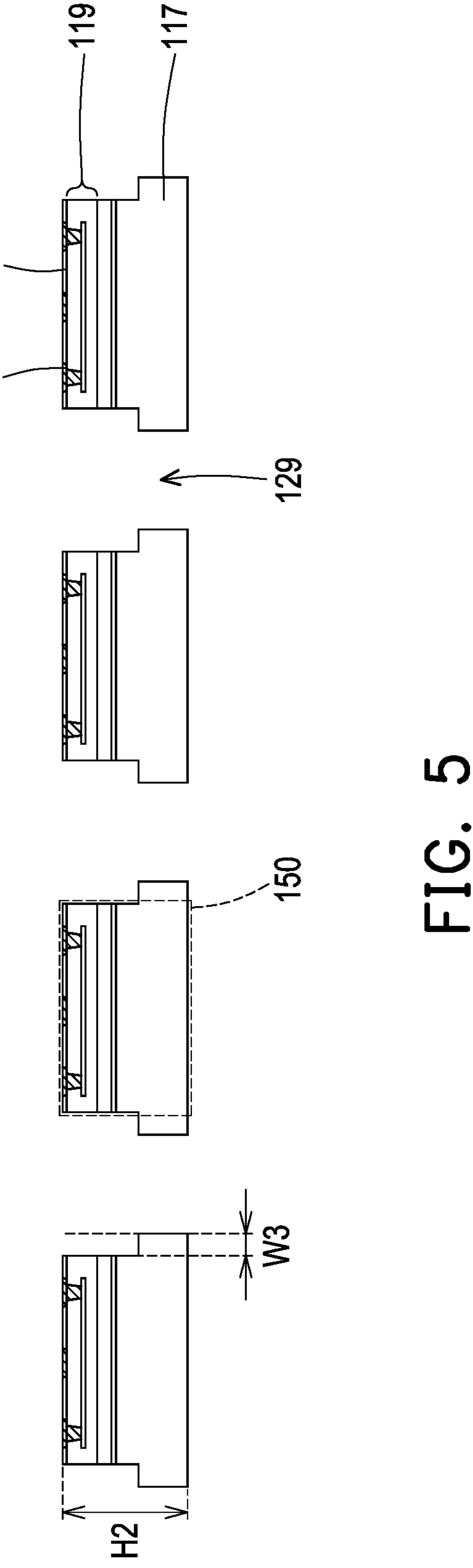

FIG. 5 illustrates a removal of the carrier substrate 130. In an embodiment, the carrier substrate 130 may be removed by directing energy (e.g., UV light, laser light, or the like) at the adhesion layer, thereby reducing its adhesion and allowing both the adhesion layer and the carrier substrate 130 to be removed from the semiconductor dies 150. In an embodiment, bottom portions of the substrate 117 extend laterally beyond sidewalls of each semiconductor die 150 by a width W3, wherein the width W3 may be up to 5 μm. The bottom portions of the substrate 117 extend from and are offset from top portions of the substrate 117, the interconnect structure 119, the bonding layer 121 and the bonding pads 123.

Figure 6:
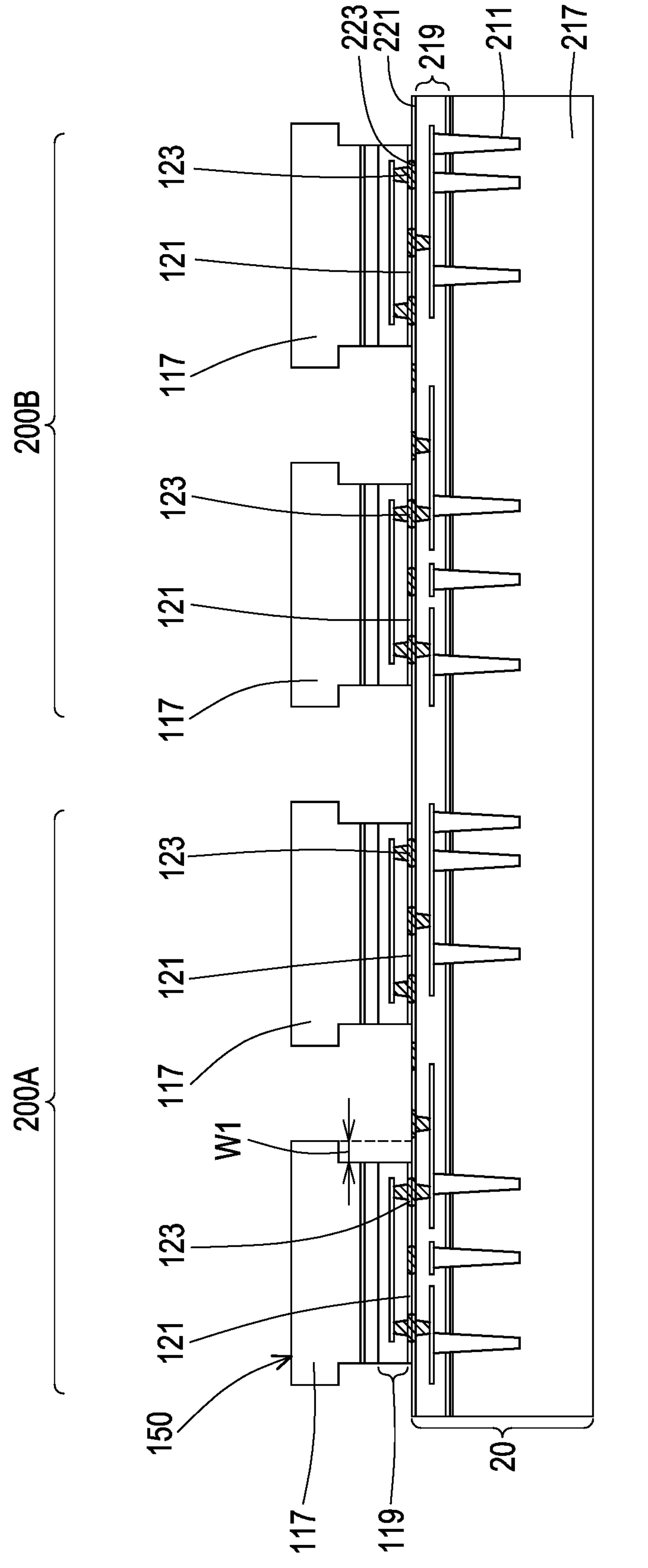
FIGS. 6 through 11 illustrate cross-sectional views of intermediate steps during a process for forming an integrated chip package in accordance with some embodiments.

In FIG. 6, a semiconductor wafer 20 is bonded to the semiconductor dies 150. The wafer 20 may also be subsequently referred to as a bottom die. The wafer 20 comprises a first package region 200A and a second package region 200B, and one or more of the integrated chip package 100 are packaged to form an integrated circuit package in each of the package regions 200A and 200B. The materials and formation processes of the features in the wafer 20 may be found by referring to the like features in the wafer 10, with the like features in the wafer 10 starting with number "1," which features correspond to the features in the wafer 20 and having reference numerals starting with number "2." For example, the wafer 20 may include a substrate 217 having devices (e.g., transistors, capacitors, diodes, resistors, or the like) formed thereon and an interconnect structure 219. The interconnect structure 219 electrically connects the devices on the substrate 217 to form one or more integrated circuits. The interconnect structure 219 includes one or more dielectric layers (for example, one or more interlayer dielectric (ILD) layers, intermetal dielectric (IMD) layers, or the like) and interconnect wirings or metallization patterns embedded in the one or more dielectric layers.

A bonding layer 221 is disposed on the interconnect structure 219, and bonding pads 223 are disposed in the bonding layer 221. The bonding pads 223 allow connections to be made to the interconnect structure 219 and the devices on the substrate 217. The wafer 20 further includes through substrate vias (TSVs) 211 which may be electrically connected to the metallization patterns in the interconnect structure 219. The TSVs 211 may be formed by forming recesses in the substrate 217 by, for example, etching, milling, laser techniques, a combination thereof, and/or the like. A thin barrier layer may be conformally deposited over the front side of the substrate 217 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer may be removed from the front side of the substrate 217 by, for example, chemical mechanical polishing. Thus, in some embodiments, the TSVs 211 may comprise a conductive material and a thin barrier layer between the conductive material and the substrate 217. In subsequent processing steps, the substrate 217 may be thinned to expose the TSVs 211 (see FIG. 8). After thinning, the TSVs 211 provide electrical connection from a back side of the substrate 217 to a front side of the substrate 217. In various embodiments, the backside of the substrate 217 may refer to a side of the substrate 217 opposite to the devices and the interconnect structure 219 while the front side of the substrate 217 may refer to a side of the substrate 217 on which the devices and the interconnect structure 219 are disposed.

Still referring to FIG. 6, the semiconductor dies 150 are bonded to the wafer 20, for example, in a hybrid bonding configuration. The semiconductor dies 150 are disposed face down such that front sides of the semiconductor dies 150 face the wafer 20 and back sides of the semiconductor dies 150 face away from the wafer 20. The semiconductor dies 150 are bonded to the bonding layer 221 on the front side of the wafer 20 and the bonding pads 223 in the bonding layer 221. For example, the bonding layer 121 of the semiconductor dies 150 may be directly bonded to the bonding layer 221 of the wafer 20, and bonding pads 123 of the semiconductor dies 150 may be directly bonded to the bonding pads 223 of the wafer 20. In an embodiment, the bond between the bonding layer 121 and the bonding layer 221 may be an oxide-to-oxide bond, or the like. The hybrid bonding process further directly bonds the bonding pads 123 of the semiconductor dies 150 to the bonding pads 223 of the wafer 20 through direct metal-to-metal bonding. Thus, electrical connection between the semiconductor dies 150 and the wafer 20 is provided by the physical connection of the bonding pads 123 to the bonding pads 223.

As an example hybrid bonding process starts with aligning the semiconductor dies 150 with the wafer 20, for example, by applying a surface treatment to one or more of the bonding layer 121 or the bonding layer 221. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layer 121 or the bonding layer 221. The hybrid bonding process may then proceed to aligning the bonding pads 123 to the bonding pads 223. Next, the hybrid bonding includes a pre-bonding step, during which the semiconductor dies 150 are put in contact with the wafer 20. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in bonding pads 123 (e.g., copper) and the metal of the bonding pads 223 (e.g., copper) inter-diffuses to each other, and hence the direct metal-to-metal bonding is formed. Although four semiconductor dies 150 are illustrated as being bonded to the wafer 20, other embodiments may include any number of semiconductor dies 150 bonded to the wafer 20.

Figure 7:
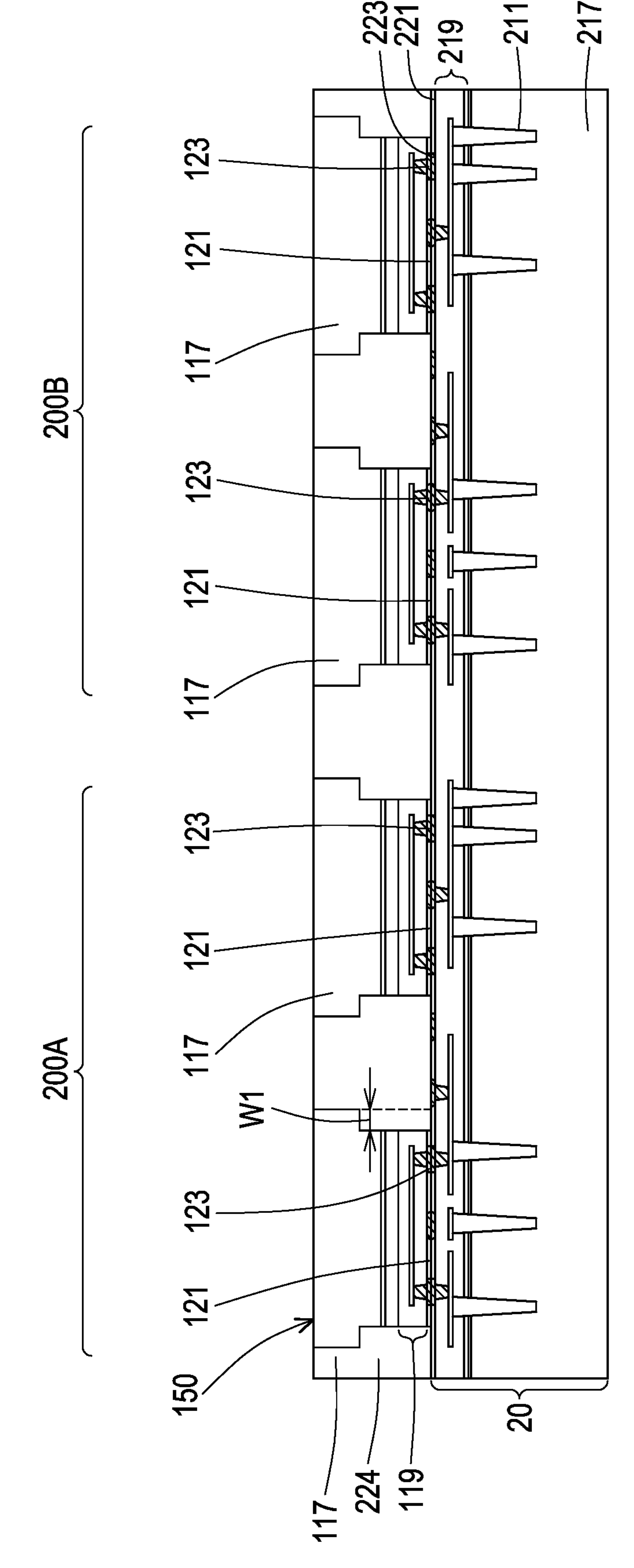

In FIG. 7, an encapsulant 224 is formed over the wafer 20 and the semiconductor dies 150, in order to encapsulate the semiconductor dies 150. The encapsulant 224 may be formed using compression molding, transfer molding, or the like. The encapsulant 224 may be an epoxy or a molding compound resin such as polyimide, polyphenylene sulfide (PPS), polyetheretherketone (PEEK), poly ether sulphone (PES), a heat resistant crystal resin, combinations of these, or the like.

FIG. 7 further illustrates a thinning process of the encapsulant 224 in order to expose top surfaces of the semiconductor dies 150. The thinning process may be performed, e.g., using a mechanical grinding, chemical approaches, or chemical mechanical polishing (CMP) process whereby chemical etchants and abrasives are utilized to react and grind away the encapsulant 224 so that the top surfaces of the semiconductor dies 150 have been exposed. After the thinning process, the top surfaces of the semiconductor dies may have planar surfaces that are also coplanar with top surfaces of the encapsulant 224.

Figure 8:
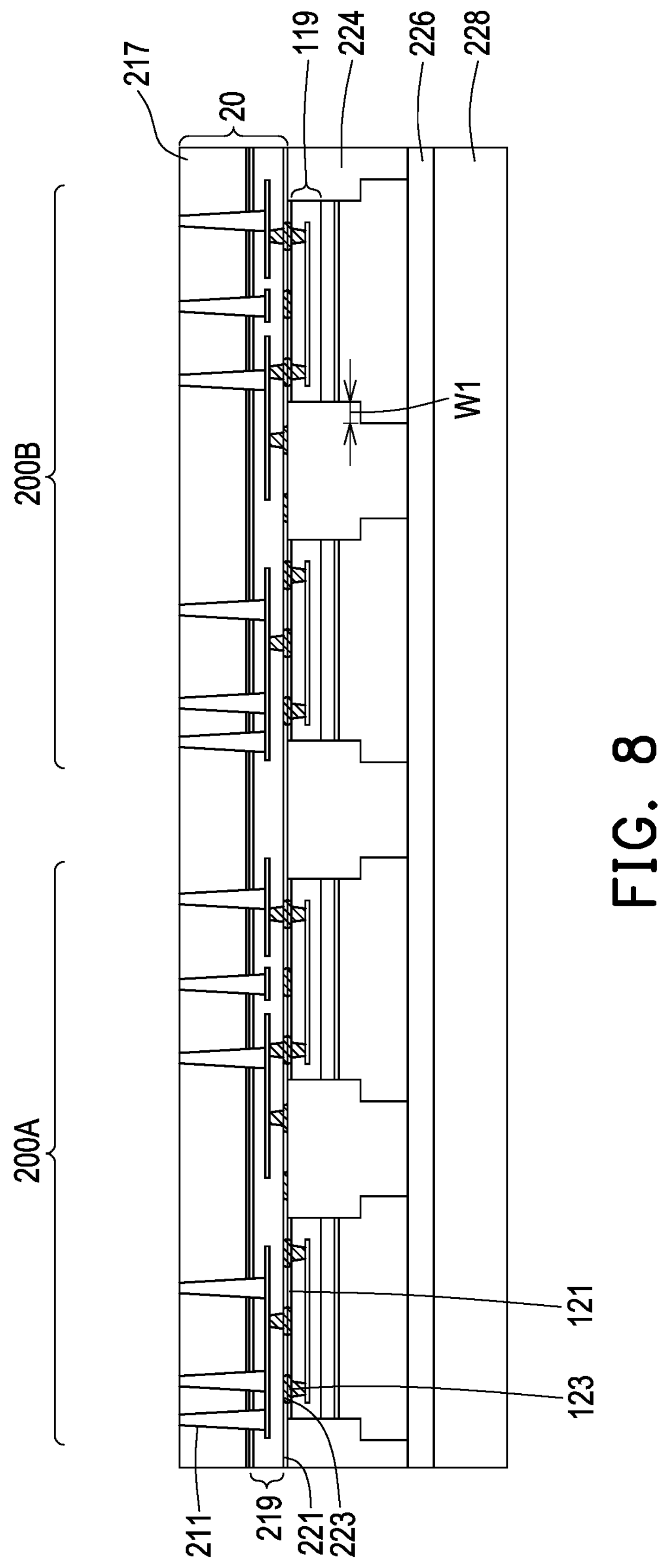

In FIG. 8, a carrier substrate 228 is attached to the structure shown previously in FIG. 7 above. In an embodiment the carrier substrate 228 comprises, for example, silicon based materials, such as glass or silicon oxide, or other materials, such as aluminum oxide, combinations of any of these materials, or the like. The carrier substrate 228 is planar in order to accommodate the attachment of the semiconductor devices 150 and the encapsulant 224, which may be attached using a release layer 226. The release layer 226 may be formed of a polymer-based material, which may be removed along with the carrier substrate 228 from the overlying structures in subsequent steps. In some embodiments, the release layer 226 is an epoxy-based thermal-release material, which loses its adhesive property when heated, such as a light-to-heat-conversion (LTHC) release coating. In other embodiments, the release layer 226 may be an ultra-violet (UV) glue, which loses its adhesive property when exposed to UV lights. The release layer 226 may be dispensed as a liquid and cured, may be a laminate film laminated onto the carrier substrate 228, or may be the like. The top surface of the release layer 226 may be leveled and may have a high degree of planarity.

After the attaching of the carrier substrate 228 to the structure shown previously in FIG. 7, a thinning process of a back side of the substrate 217 is performed to expose the TSVs 211. The thinning process of the back side of the substrate 217 may be performed by a planarization process such as CMP, grinding, or etching. The thinning process may result in surfaces of the TSVs 211 being level with surfaces of the back side of the substrate 217.

Figure 9:
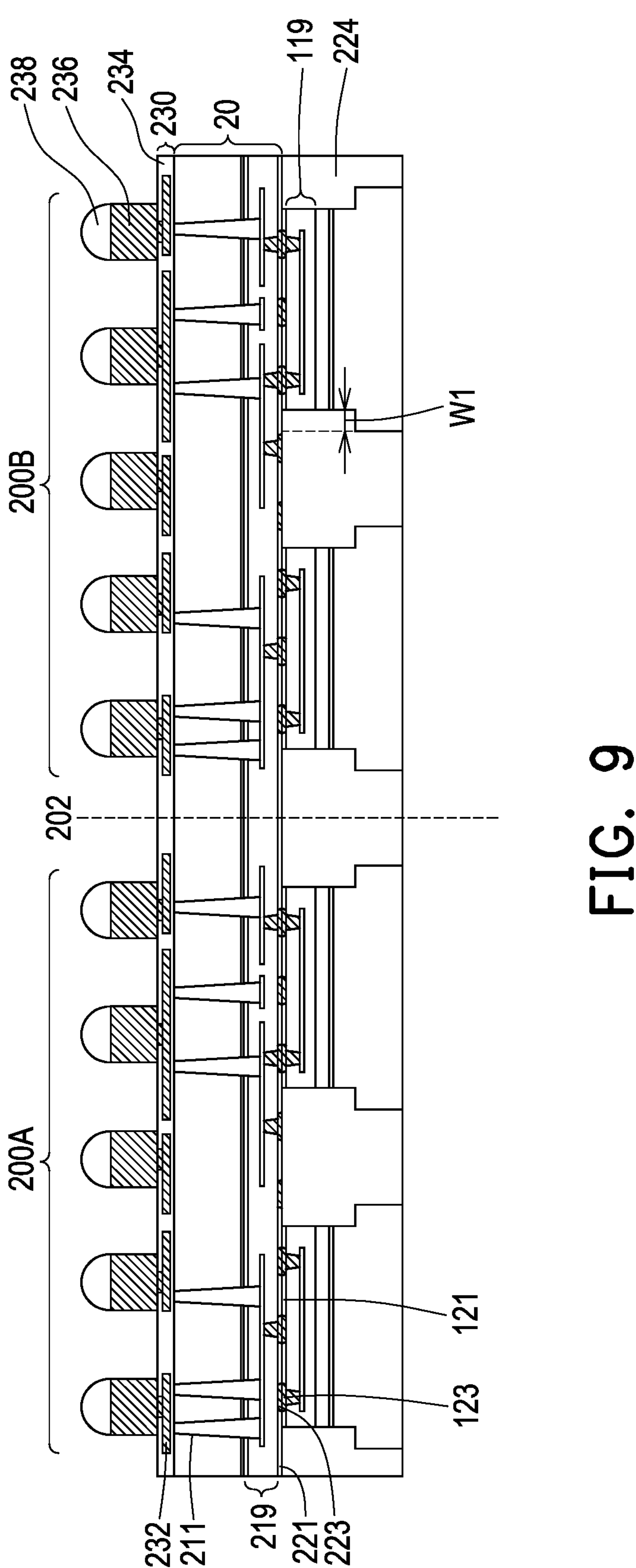

In FIG. 9, a redistribution structure 230 is formed over the back side of the substrate 217. The redistribution structure 230 comprises one or more redistribution layers (RDLs) over the back side side of the substrate 217 that are in electrical connection with the TSVs 211. In an embodiment the redistribution structure 230 may be formed by initially forming a RDL 232 over and in electrical connection with the TSVs 111. In an embodiment the RDL 232 may be formed by initially forming a seed layer (not shown) of a titanium copper alloy through a suitable formation process such as CVD or sputtering. A mask layer (e.g., a photoresist) may then be formed to cover the seed layer, and the mask layer may then be patterned to expose those portions of the seed layer that are located where the RDL 232 is desired to be located.

Once the mask layer has been formed and patterned, a conductive material, such as copper, may be formed on the seed layer through a deposition process such as plating, or the like. Any other suitable materials, such as AlCu or Au, and any other suitable processes of formation, such as CVD or PVD, may be used to form the RDL 232. Once the conductive material has been formed, the mask layer may be removed through a suitable removal process such as chemical stripping and/or ashing. Additionally, after the removal of the mask layer, those portions of the seed layer that were covered by the mask layer may be removed through, for example, a suitable etch process using the conductive material as a mask.

Once the RDL 232 has been formed, a redistribution dielectric layer 234 may be formed. In an embodiment, the redistribution dielectric layer 234 may comprise polybenzoxazole (PBO), polyimide, a polyimide derivative (e.g., a low temperature cured polyimide), or the like. The redistribution dielectric layer 234 may be formed using, e.g., a spin-coating process, or the like. Once the redistribution dielectric layer 234 has been formed, the redistribution dielectric layer 234 may be patterned to form openings that expose portions of the underlying RDL 232. In an embodiment, the redistribution dielectric layer 234 may be patterned using, e.g., a photolithographic masking and etching process. However, any suitable process may be utilized to expo se the underlying RDL 234.

Although the redistribution structure 230 is illustrated in FIG. 9 as having a single RDL and a single redistribution dielectric layer, the redistribution structure 230 may comprise additional RDLs and redistribution dielectric layers to provide additional interconnection options. Any suitable number of RDLs and redistribution dielectric layers may be formed using the processes and materials described for the formation of the RDL 232 and the redistribution dielectric layer 234.

Once the redistribution dielectric layer 234 has been formed and patterned, conductive connectors 236 may be formed. In an embodiment, the conductive connectors 236 may be conductive pillars, such as copper pillars. In an embodiment, the conductive pillars may be formed by initially forming a seed layer and then applying and patterning a mask layer (e.g., a photoresist) with openings exposing the seed layer where the conductive pillars are desired to be located. Conductive material, such as copper, tungsten, other conductive metals, or the like, may then be formed within the mask layer using a process such as electroplating, electroless plating, or the like. Once formed, the mask layer is removed and the seed layer is patterned using the conductive material as a mask. The conductive connectors 236 are electrically connected to the RDL 232 of the redistribution structure 230.

After the formation of the conductive connectors 236, conductive connectors 238 may be formed over the conductive connectors 236. The conductive connectors 238 are formed so as to cap the conductive connectors 236 with a solder material, by initially forming a layer of tin through any suitable method such as evaporation, electroplating, printing, solder transfer, or the like, to place the material of the cap. Once in place, a reflow process may be performed in order to shape the material into the desired bump shape and form the conductive connectors 238.

Still referring to FIG. 9, a de-bonding of the carrier substrate 228 is then performed to detach (or "de-bond") the carrier substrate 228 from the semiconductor dies 150 and the encapsulant 224. In accordance with some embodiments, the de-bonding includes projecting a light such as a laser light or an UV light on the release layer 226 so that the release layer 226 decomposes under the heat of the light. The carrier substrate 228 can then be mechanically removed from the integrated chip package 100.

Figure 10:
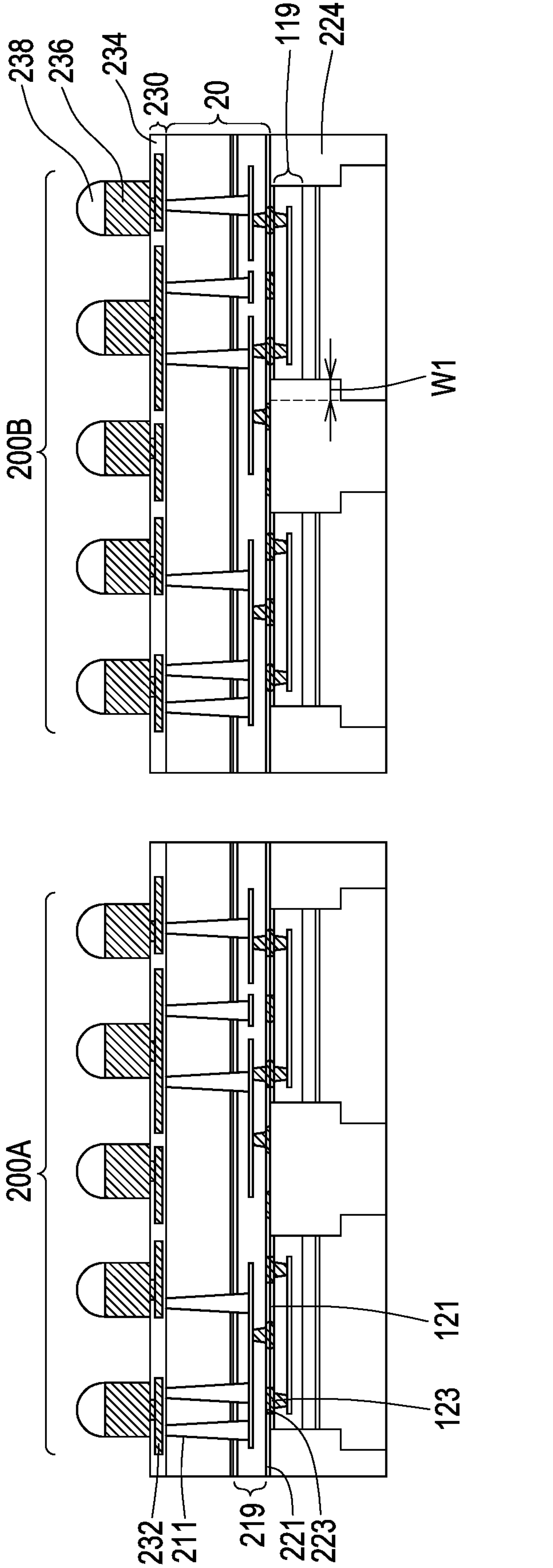

In FIG. 10, a singulation process is performed by sawing along scribe line regions 202, e.g., between the first package region 200A and the second package region 200B (shown previously in FIG. 9). The sawing singulates the first package region 200A from the second package region 200B. The resulting, singulated device stack is from one of the first package region 200A or the second package region 200B.

Figure 11:
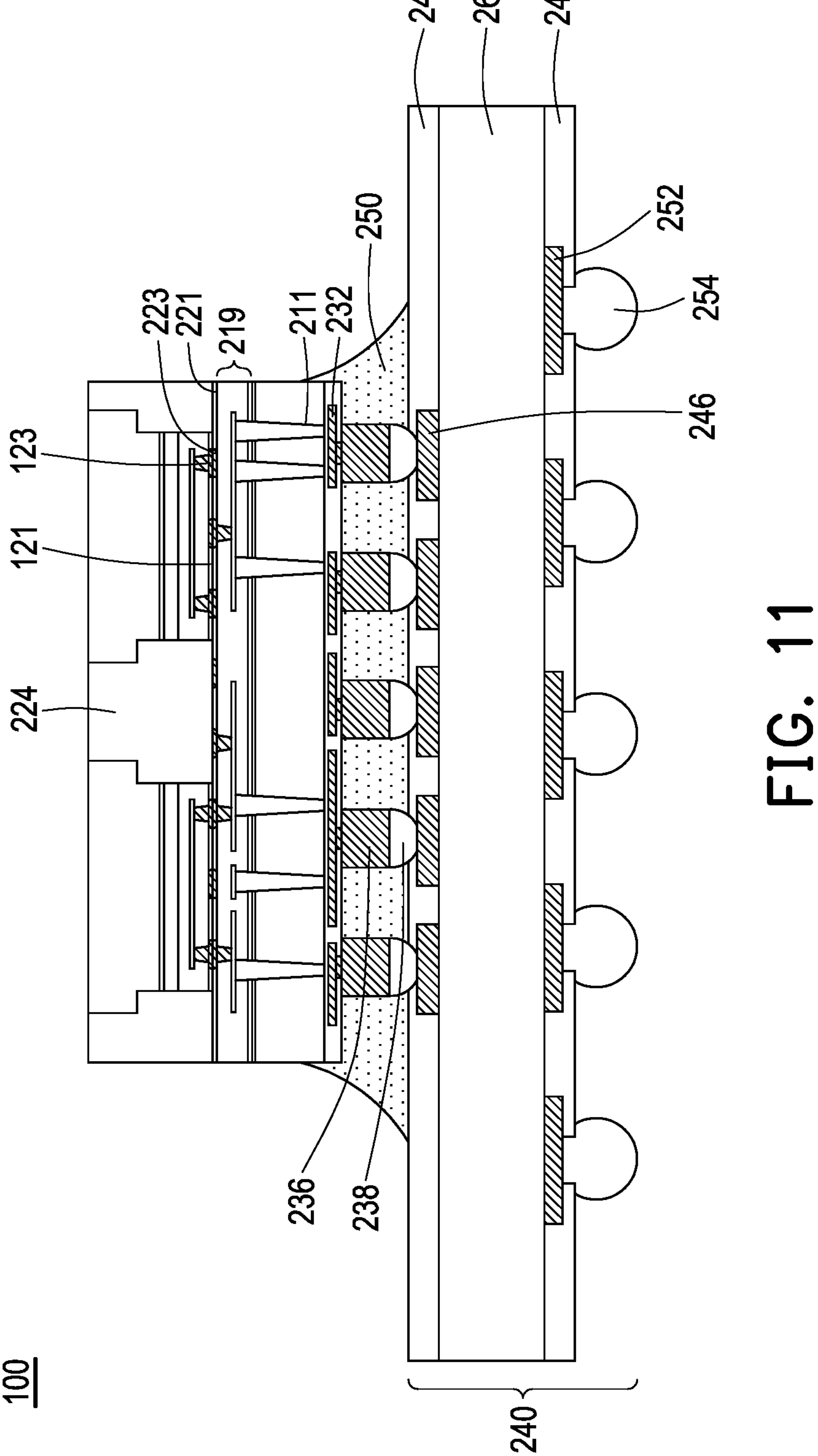

In FIG. 11, a package substrate 240 is coupled to the singulated device stack from one of the first package region 200A or the second package region 200B that was shown previously in FIG. 10. The package substrate 240 may comprise an interposer, a package, a core substrate, a coreless substrate, a printed circuit board (PCB), or the like. In an embodiment, the package substrate 240 includes a substrate core 260 and bond pads 246 over the substrate core 260. The substrate core 260 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 260 may be an SOI substrate. Generally, an SOI substrate includes a layer of a semiconductor material such as epitaxial silicon, germanium, silicon germanium, SOI, SGOI, or combinations thereof. The substrate core 260 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 260.

The substrate core 260 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 260 may also include metallization layers and vias (not shown), with the bond pads 246 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 260 is substantially free of active and passive devices.

In some embodiments, the conductive connectors 238 are reflowed to attach the redistribution structure 230 to the bond pads 246. The conductive connectors 238 electrically and/or physically couple the package substrate 240, including metallization layers in the substrate core 260, to the redistribution structure 230. In some embodiments, a solder resist 248 is formed on the substrate core 260. The conductive connectors 238 may be disposed in openings in the solder resist 248 to be electrically and mechanically coupled to the bond pads 246. The solder resist 248 may be used to protect areas of the substrate core 260 from external damage.

The conductive connectors 238 may have an epoxy flux (not shown) formed thereon before they are reflowed with at least some of the epoxy portion of the epoxy flux remaining after the redistribution structure 230 is attached to the package substrate 240. This remaining epoxy portion may act as an underfill to reduce stress and protect the joints resulting from reflowing the conductive connectors 238. In some embodiments, an underfill 250 may be formed between the redistribution structure 230 and the package substrate 240 and surrounding the conductive connectors 236 and 238. The underfill 250 may be formed by a capillary flow process after the coupling of the redistribution structure 230 to the package substrate 240 or may be formed by a suitable deposition method before the package substrate 240 is coupled to the redistribution structure 230.

In an embodiment, the package substrate 240 may comprise bond pads 252 over the substrate core 260. Conductive connectors 254 may be coupled to the bond pads 252 to allow for the electrical coupling of the package substrate 240 to external circuits or devices. The conductive connectors 254 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 254 may include a conductive material such as solder, copper, aluminum, gold, nickel, silver, palladium, tin, the like, or a combination thereof. In some embodiments, the solder resist 248 is formed on the substrate core 260 and the conductive connectors 254 may be disposed in openings in the solder resist 248 to be electrically and mechanically coupled to the bond pads 252. The solder resist 248 may be used to protect areas of the substrate core 260 from external damage.

In some embodiments, passive devices (e.g., surface mount devices (SMDs), not shown) may also be attached to the package substrate 240 (e.g., to the bond pads 246). For example, the passive devices may be bonded to a same surface of the package substrate 240 as the conductive connectors 238.

The embodiments of the present disclosure have some advantageous features. The embodiments include a method for the formation of an integrated chip package. To form the integrated chip package, a wafer comprising a number of semiconductor dies (e.g., top dies) is singulated to obtain singulated semiconductor dies. The wafer comprises a bonding layer over a semiconductor substrate. To singulate the wafer, a first plasma dicing process is performed to form two grooves in the wafer between adjacent semiconductor dies of the wafer. The two grooves may extend through the bonding layer. A second blade dicing process is then performed to cut the wafer along a dicing region between the two grooves and form a trench in between the adjacent semiconductor dies, wherein the trench extends to a deeper depth than either of the two grooves. As a result, this allows for the singulation of a much thicker wafer (e.g., greater than 100 μm) while still using a plasma dicing process. Plasma dicing allows for highly-parallel, high throughput, and particle-free singulation of dies. In addition, the use of the first plasma dicing process to form the grooves in the bonding layer results in reduced damage and less physical impact to the bonding layer which is subsequently used to bond each of the singulated semiconductor dies (e.g., the top dies) to a bottom die. As a result, the bonding between each of the singulated semiconductor dies and the bottom die is improved, and device reliability is enhanced.

In accordance with an embodiment, a method of manufacturing a semiconductor device includes forming a first bonding layer over a substrate of a first wafer, the first wafer including a first semiconductor die and a second semiconductor die; performing a first dicing process to form two grooves that extend through the first bonding layer, the two grooves being disposed between the first semiconductor die and the second semiconductor die; performing a second dicing process to form a trench that extends through the first bonding layer and partially through the substrate of the first wafer, where the trench is disposed between the two grooves; and thinning a backside of the substrate of the first wafer until the first semiconductor die is singulated from the second semiconductor die. In an embodiment, the method further includes bonding the first semiconductor die and the second semiconductor die to a second wafer, where the first wafer includes first bonding pads in the first bonding layer, where the second wafer includes second bonding pads in a second bonding layer, and where the bonding includes bonding the first bonding pads to the second bonding pads using direct metal-to-metal bonding; and bonding the first bonding layer to the second bonding layer using direct oxide-to-oxide bonding. In an embodiment, the two grooves also extend partially through the substrate of the first wafer. In an embodiment, the two grooves have a first depth measured from a point that is level with a top surface of the first bonding layer to a bottom surface of the two grooves, and the trench has a second depth measured from a point that is level with a top surface of the first bonding layer to a bottom surface of the trench, and where the second depth is greater than the first depth. In an embodiment, the first depth is in a range from 10 μm to 50 μm. In an embodiment, the first dicing process includes a plasma dicing process, and the second dicing process includes a blade dicing process. In an embodiment, the first dicing process includes deep reactive ion etching (DRIE) using a fluorine plasma.

In accordance with an embodiment, a method of manufacturing a semiconductor device includes forming a first bonding layer over a substrate of a first wafer, the first wafer including a plurality of top dies; and singulating the first wafer to separate each of the plurality of top dies from other top dies of the plurality of top dies, where singulating the first wafer includes performing a plasma dicing process to form two grooves that extend through the first bonding layer, the two grooves being disposed between adjacent top dies of the plurality of top dies; performing a blade dicing process to form a trench along a dicing path that extends through the first bonding layer and partially through the substrate of the first wafer, where the dicing path extends into portions of the two grooves; and grinding a backside of the substrate of the first wafer to remove a material of the substrate of the first wafer that is below the trench. In an embodiment, during the plasma dicing process the first bonding layer and top portions of the first wafer are removed in corner regions of each of the plurality of top dies. In an embodiment, each of the corner regions is adjacent to a first sidewall of a corresponding top die of the plurality of top dies, where each first sidewall of the corresponding top die is adjacent to a second sidewall of the corresponding top die, where each first sidewall of the corresponding top die is also adjacent to a third sidewall of the corresponding top die, and where the first sidewall of the corresponding top die is slanted in a top down view such that it is not be disposed at a right angle relative to the second sidewall of the corresponding top die and the third sidewall of the corresponding top die. In an embodiment, a first angle between the first sidewall of the corresponding top die and the second sidewall of the corresponding top die is in a range from 130° to 140°, and a second angle between the first sidewall of the corresponding top die and the second sidewall of the corresponding top die is in a range from 130° to 140°. In an embodiment, the plasma dicing process includes an etching process that uses fluorine plasma as an etchant. In an embodiment, a width of each of the first groove and the second groove is in a range from 10 μm to 50 μm. In an embodiment, performing the plasma dicing process includes forming a first groove of the two grooves adjacent to a first sidewall of a first top die of the plurality of top dies; and forming a second groove adjacent to a second sidewall of the first top die, where the first sidewall of the first top die is on an opposite side of the first top die as the second sidewall of the first top die.

In accordance with an embodiment, a package includes a first die over and bonded to a wafer, where a first dielectric layer of the first die is directly bonded to a second dielectric layer of the wafer, where the first die includes a bottom portion of the first die; and a top portion of the first die, where the top portion extends laterally beyond sidewalls of the bottom portion of the first die by a width that is up to 5 μm, where a corner region of the bottom portion of the first die includes a first sidewall; a second sidewall connected to the first sidewall; and a third sidewall connected to the first sidewall, a first angle between the first sidewall and the second sidewall is greater than 90°; through substrate vias (TSVs) extending through a portion of the wafer; and a redistribution structure on a backside of the wafer, where the redistribution structure is electrically connected to the first die through the TSVs. In an embodiment, the package further includes a package substrate coupled to the redistribution structure using conductive connectors. In an embodiment, a height of the bottom portion of the first die is in a range from 10 μm to 50 μm. In an embodiment, a package further includes a molding compound surrounding the bottom portion of the first die and the top portion of the first die, where the molding compound is disposed between the second dielectric layer and a bottom surface of the top portion of the first die. In an embodiment, a material of the top portion of the first die is different from materials of the bottom portion of the first die. In an embodiment, the first angle between the first sidewall of the bottom portion of the first die and the second sidewall of the bottom portion of the first die is in a range from 130° to 140°, and where a second angle between the first sidewall of the bottom portion of the first die and the third sidewall of the bottom portion of the first die is in a range from 130° to 140°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a first bonding layer over a substrate of a first wafer, the first wafer comprising a first semiconductor die and a second semiconductor die;

performing a first dicing process to form two grooves that extend through the first bonding layer, the two grooves being disposed between the first semiconductor die and the second semiconductor die;

performing a second dicing process to form a trench that extends through the first bonding layer and partially through the substrate of the first wafer, wherein the trench is disposed between the two grooves; and thinning a backside of the substrate of the first wafer until the first semiconductor die is singulated from the second semiconductor die; and bonding the first semiconductor die and the second semiconductor die to a second wafer by bonding first bonding pads of the first semiconductor die and the second semiconductor die to second bonding pads of the second wafer, and bonding the first bonding layer to a second bonding layer of the second wafer, wherein the first bonding pads are disposed in the first bonding layer, and the second bonding pads are disposed in the second bonding layer.

2. The method of claim 1, wherein bonding the first bonding pads of the first semiconductor die and the second semiconductor die to the second bonding pads of the second wafer comprises bonding the first bonding pads to the second bonding pads using direct metal-to-metal bonding, and wherein bonding the first bonding layer to the second bonding layer of the second wafer comprises bonding the first bonding layer to the second bonding layer using direct oxide-to-oxide bonding.

3. The method of claim 1, wherein the two grooves also extend partially through the substrate of the first wafer.

4. The method of claim 3, wherein the two grooves have a first depth measured from a point that is level with a top surface of the first bonding layer to a bottom surface of the two grooves, and the trench has a second depth measured from a point that is level with a top surface of the first bonding layer to a bottom surface of the trench, and wherein the second depth is greater than the first depth.

5. The method of claim 4, wherein the first depth is in a range from 10 μm to 50 μm.

6. The method of claim 1, wherein the first dicing process comprises a plasma dicing process, and the second dicing process comprises a blade dicing process.

7. The method of claim 6, wherein the first dicing process comprises deep reactive ion etching (DRIE) using a fluorine plasma.

8. A method of manufacturing a semiconductor device, the method comprising:

forming a first bonding layer over a substrate of a first wafer, the first wafer comprising a plurality of top dies;

singulating the first wafer to separate each of the plurality of top dies from other top dies of the plurality of top dies, wherein singulating the first wafer comprises:

performing a plasma dicing process to form two grooves that extend through the first bonding layer, the two grooves being disposed between adjacent top dies of the plurality of top dies;

performing a blade dicing process to form a trench along a dicing path that extends through the first bonding layer and partially through the substrate of the first wafer, wherein the dicing path extends into portions of the two grooves; and grinding a backside of the substrate of the first wafer to remove a material of the substrate of the first wafer that is below the trench; and bonding the plurality of top dies to a second wafer by bonding first bonding pads of the plurality of top dies to second bonding pads of the second wafer, and bonding the first bonding layer to a second bonding layer of the second wafer, wherein the first bonding pads are disposed in the first bonding layer, and the second bonding pads are disposed in the second bonding layer.

9. The method of claim 8, wherein during the plasma dicing process the first bonding layer and top portions of the first wafer are removed in corner regions of each of the plurality of top dies.

10. The method of claim 9, wherein each of the corner regions is adjacent to a first sidewall of a corresponding top die of the plurality of top dies, wherein each first sidewall of the corresponding top die is adjacent to a second sidewall of the corresponding top die, wherein each first sidewall of the corresponding top die is also adjacent to a third sidewall of the corresponding top die, and wherein the first sidewall of the corresponding top die is slanted in a top down view such that it is not disposed at a right angle relative to the second sidewall of the corresponding top die and the third sidewall of the corresponding top die.

11. The method of claim 10, wherein a first angle between the first sidewall of the corresponding top die and the second sidewall of the corresponding top die is in a range from 130° to 140°, and a second angle between the first sidewall of the corresponding top die and the second sidewall of the corresponding top die is in a range from 130° to 140°.

12. The method of claim 8, wherein the plasma dicing process comprises an etching process that uses fluorine plasma as an etchant.

13. The method of claim 8, wherein a width of a first groove of the two grooves and a second groove of the two grooves is in a range from 10 μm to 50 μm.

14. The method of claim 8, wherein performing the plasma dicing process comprises:

forming a first groove of the two grooves adjacent to a first sidewall of a first top die of the plurality of top dies; and forming a second groove adjacent to a second sidewall of the first top die, wherein the first sidewall of the first top die is on an opposite side of the first top die as the second sidewall of the first top die.

15. A method of manufacturing a semiconductor device, the method comprising:

forming a first bonding layer over a substrate of a first wafer, the first wafer comprising a first semiconductor die and a second semiconductor die;

forming two grooves in a top portion of the first wafer, wherein the two grooves are disposed between the first semiconductor die and the second semiconductor die, wherein during forming the two grooves, the first bonding layer and top portions of the first wafer are removed in corner regions of each of the first semiconductor die and the second semiconductor die, wherein a first corner region of the corner regions is adjacent to a first sidewall of the first semiconductor die, wherein the first sidewall of the first semiconductor die is adjacent to a second sidewall of the first semiconductor die and a third sidewall of the first semiconductor die, and wherein the first sidewall of the first semiconductor die is slanted in a top down view such that it is not be disposed at a right angle relative to the second sidewall of the first semiconductor die and the third sidewall of the first semiconductor die;

forming a trench along a dicing path that extends through the top portion of the first wafer, wherein the dicing path extends into portions of the two grooves; and thinning a backside of the substrate to remove a material of a bottom portion of the first wafer until the first semiconductor die is singulated from the second semiconductor die.

16. The method of claim 15, wherein forming the two grooves in the top portion of the first wafer comprises performing a plasma dicing process using fluorine plasma as an etchant.

17. The method of claim 15, wherein forming the trench along the dicing path comprises performing a blade dicing process.

18. The method of claim 15, further comprising:

bonding the first semiconductor die and the second semiconductor die to a second wafer, wherein the first wafer comprises first bonding pads in the first bonding layer, wherein the second wafer comprises second bonding pads in a second bonding layer, and wherein the bonding comprises:

bonding the first bonding pads to the second bonding pads using direct metal-to-metal bonding; and bonding the first bonding layer to the second bonding layer using direct oxide-to-oxide bonding.

19. The method of claim 15, wherein after forming the trench, a bottom surface in the trench is lower than bottom surfaces in the two grooves.

20. The method of claim 15, wherein a width of each of the two grooves is in a range from 10 μm to 50 μm.

* * * * *